(12) United States Patent
Tsai

(10) Patent No.: US 6,600,332 B2
(45) Date of Patent: Jul. 29, 2003

(54) TABLET WITH SHORT TESTING FUNCTION AND METHOD OF MEASURING

(75) Inventor: Hsin-Chien Tsai, Hsin-Chu (TW)

(73) Assignee: Aiptek International Inc. (TW)

( * ) Notice: Subject to any disclaimer, the term of this patent is extended or adjusted under 35 U.S.C. 154(b) by 116 days.

(21) Appl. No.: 09/930,854

(22) Filed: Aug. 16, 2001

(65) Prior Publication Data

US 2003/0034790 A1 Feb. 20, 2003

(51) Int. Cl.[7] .............................................. G01R 31/02
(52) U.S. Cl. ...................... 324/763; 324/158.1; 324/537
(58) Field of Search ................................ 324/754, 761, 324/763, 158.1, 762, 533–535, 537–538

(56) References Cited

U.S. PATENT DOCUMENTS 5,006,808 A * 4/1991 Watts .......................... 324/537
5,877,631 A * 3/1999 Takahashi ................... 324/533
6,097,202 A * 8/2000 Takahashi ................... 324/761

* cited by examiner

Primary Examiner—Kamand Cuneo
Assistant Examiner—Minh N. Tang

(57) ABSTRACT

A method of measuring tablet. Firstly, a tables is provided that has a processing device area, a ground point and numerous separate conductive lines, each conductive line has a first terminal electrically connected with the processing device area and a second terminal electrically connected with the ground point, and each conductive line has a switch near to the second terminal. Next, these switches are turned off so as to let the processing device area be electrically separated from the ground point. Then, a testing process is performed on each conductive line in sequence, the testing process measures the connection between each conductive line and other conductive lines to decide whether a short has happened.

18 Claims, 7 Drawing Sheets provide a tablet that has a processing device area, a ground point and numerous separate conductive lines. Each conductive line has a first terminal which is electrically connected with the processing device area and a second terminal which is electriaclly connected with the ground point, Moreover, each conductive line has a switch which is located near to the second terminal, and the layout of these conductive lines provide an antenna array within the tablet. — 31 turn off these switches, so let the processing device area be electrically separated from the ground point. — 32 perform a testing process on each conductive line in sequence. The testing process measures the connection between each conductive line and other conductive lines to decide whether short is happened. — 33

FIG. 2A provide a tablet that has a processing device area, a ground point and numerous separate conductive lines. Each conductive line has a first terminal which is electrically connected with the processing device area and a second terminal which is electriaclly connected with the ground point, Moreover, each conductive line has a switch which is located near to the second terminal, and the layout of these conductive lines provide an antenna array within the tablet. — 31 turn off these switches, so let the processing device area be electrically separated from the ground point. — 32 perform a testing process on each conductive line in sequence. The testing process measures the connection between each conductive line and other conductive lines to decide whether short is happened. — 33 perform a repairing process for repairing the tablet. — 34

FIG. 2B provide a tablet that has a processing device area, a ground point and numerous separate conductive lines. Each conductive line has a first terminal which is electrically connected with the processing device area and a second terminal which is electriaclly connected with the ground point, Moreover, each conductive line has a switch which is located near to the second terminal, and the layout of these conductive lines provide an antenna array within the tablet. — 31 turn off these switches, so let the processing device area be electrically separated from the ground point. — 32 perform a testing process on each conductive line in sequence. The testing process measures the connection between each conductive line and other conductive lines to decide whether short is happened. — 33 turn on these switches so let each first terminal be electrically connected with the second terminal of same conductive line. — 35

FIG. 2C

TABLET WITH SHORT TESTING FUNCTION AND METHOD OF MEASURING

BACKGROUND OF THE INVENTION

1. Field of the Invention

This invention relates generally to a tablet with a short testing function and method of forming it. More particularly, the invention relates to the tablet and method that could measure the short between different conductive lines which forms an antenna array.

2. Description of the Prior Art

The current handwriting recognition system at least has the tablet and the wireless pen. The user moves the wireless pen over the tablet for inputting a message, just as the user uses a conventional paper and pen, and the tablet receives the message transmitted from the wireless pen to decide both the location of the wireless pen and the current working mode.

FIG. 1A and FIG. 1B show the basic structure of conventional tablet, at least has following elements in and on base 11: processing device 12, numerous conductive lines 13 and ground point 14. Moreover, each conductive line 13 has a first terminal which is electrically coupled with ground point 14 and a second terminal which is electrically coupled with processing device 12, the layout of all elements is that all conductive lines 13 forms an antenna array but are separate from each other, and processing device usually is located on the edge of base 11. Herein, ground point 14 is used to let all conductive lines 13 have same potential, to avoid processing device 12 producing errors during analysising messages from conductive lines 12. Certainly, because conductive lines 13, or antenna array, must be able to distinguish the location of the wireless pen, conductive lines 13 can not only distributed along the X-axis or the Y-axis of the plane coordinate. Further, base 11 usually are multi-layer board to provide conductive line 13 enough space for distributing, and the layout of conductive lines 13, or the layout of antenna array, also has numerous variations. Herein, FIG. 1A and FIG. 1B only show a possible layout: upper layer and lower layer are used to measure X-axis messages and Y-axis messages separately, but two layers use same processing device 12 and same ground point.

Obviously, when a short occurs between different conductive lines 13, the real transmitted paths of electrical messages among these conductive lines are different from the predetermined transmitted paths of electrical messages among these conductive lines. Thus, messages along any specific conductive line 13 would be interfered by message along other conductive lines 13 while the specific conductive line 13 is shorted, and then processing device 12 would not be able to decide the location of the wireless pen by analyzing messages from different conductive lines 13.

Furthermore, because all conductive lines 13 are electrically coupled with ground point 14, it is impossible to decide whether the short has happened and where the short has happened only by measuring the resistance between different conductive lines 12. Conventional fabrications almost check quality of tablet by human efforts, and then unavoidable defects are low efficiency and high failure, especially while base 11 is made of multi-layer board and pattern density within tablet being increased.

In short, current technologies are not able to decide whether a short has happened and where the short has happened, and then it is desired to develop a new technology to check short within tablet.

SUMMARY OF THE INVENTION

One main object of the invention is to effectively check whether tablet has unexpected short.

Another object of the invention is to decide whether the table has a short and where the short is with minimizing modification of both structure and fabrication of tablet.

Because conventional technology electrically couples all conductive lines with ground point, the short could not be found only by simply measuring the resistance between different conductive lines. The invention propose a key of solution: the object of electrically coupling conductive lines with the ground point is to ensure messages transmitted on different conductive lines have same referring level. In other words, it is not desired to electrically couple all conductive lines with the ground point before the tablet is operated, such as during the period of checking an abnormal short within the tablet.

Therefore, the invention solves conventional problems by inserting a switch in one terminal of conductive line which is closed to ground point. Initially, all switches are turned off to let all conductive lines, at least almost all conductive lines, become electrically separated from the ground point. Thus, each conductive line should be separated from other conductive lines, and then it is possible to detect a short by simply measuring the resistance between different conductive lines. Further, after the detection of a short is finished, all switches are turned on to let all conductive lines be electrically coupled with the ground point, and then the tablet could be used to receive messages from the wireless pen.

BRIEF DESCRIPTION OF THE DRAWINGS

A more complete appreciation and many of the attendant advantages will be readily obtained as the same becomes better understood by reference to the following detailed description when considered in connection with the accompanying drawings.

FIG. 2A through FIG. 2C show several possible essential flow of one preferred embodiment of this present invention.

DESCRIPTION OF THE PREFERRED EMBODIMENT

Figure 1A:
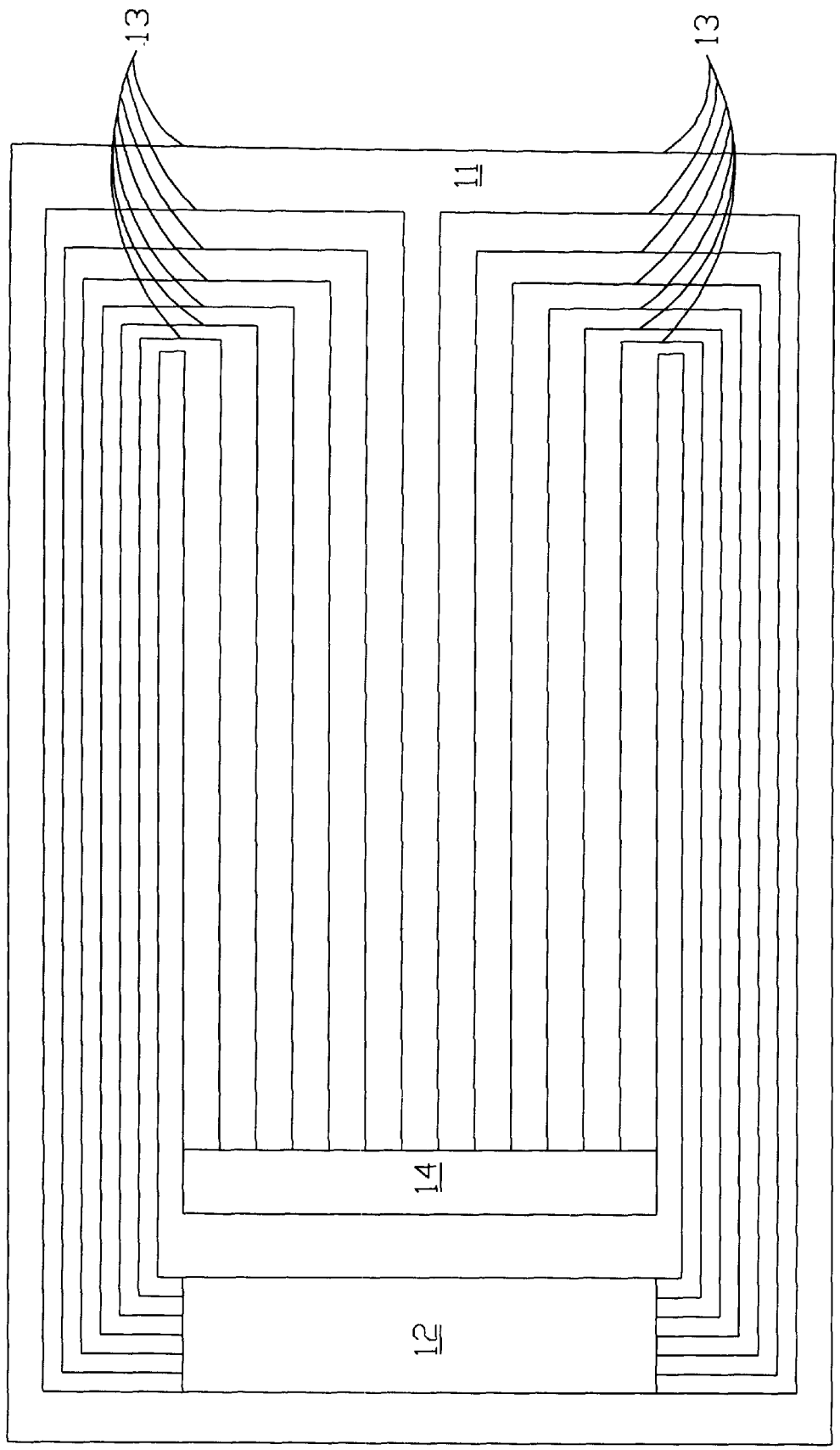
FIG. 1A through FIG. 1B show essential structure of one possible kind of conventional tablets.

Some preferred embodiments are discussed in detail below, and are used to clearly explain this invention. However, it should be emphasized that this claimed invention could be applied to other applications and is not limited by these embodiments. Therefore, available scope of this invention is not limited by present embodiments but the claims.

One preferred embodiment of this invention is a method of measuring tablet. As shown in FIG. 2A, FIG. 2B, and FIG. 2C, the method at least has the following essential steps.

As providing block 21 shows, provide a tablet that has a processing device area, a ground point and numerous separate conductive lines. Each conductive line has a first terminal which is electrically connected with the processing device area and a second terminal which is electrically connected with the ground point. Moreover, each conductive line has a switch which is located near to the second terminal, and the layout of these conductive lines provide an antenna array within the tablet.

As turning off block 22 shows, turn off these switches, so let the processing device area be electrically separated from the ground point.

As testing in sequence block 23 shows, perform a testing process on each conductive line in sequence. The testing process measures the connection between each conductive line and other conductive lines to decide whether short is happened. Herein, the short usually is induced by following reasons: the failure during fabrication of tablet, the failure during storage of tablet, and the failure during movement of tablet.

Indisputably, one main difference between the embodiment and conventional technology is the application of turning off block 22. Because turning off block 22 turns off all switches, these conductive are not electrically coupled with the ground point. Moreover, because processing device area maybe be empty or be not power on, each conductive lines also is not electrically coupled with other conductive lines. In other words, each conductive line should be electrically separate from other conductive lines at that time. Thus, while any conduction between some specific conductive lines being measured, it is indisputable that unexpected short is happened among these specific conductive lines.

Certainly, for practical applications, when testing in sequence block 23 is finished and at least one short is found, it is possible to perform a repairing process for repairing the tablet, as FIG. 2B shows. Surely, as FIG. 2C shows, when testing in sequence block 23 is finished and no short is found, it is possible to turn on these switches so let each first terminal be electrically connected with the second terminal of same conductive line, and then the tested tablet could be used to receive messages from wireless tablet.

However, it should be emphasized that details of the switch, details of the repairing process, and details of the testing process all are not key points of this embodiment. Any switch could control the connection between conductive line and ground point, any repairing process could eliminate the short, and any testing process could check the existence of short are acceptable for this embodiment.

For example, one possible testing process at least has the following steps: Initially, an electrical signal is applied on part of one tested conductive line, whereby the part is electrically connected with the processing device area. Next, other conductive lines are measured to check the electrical signal appear on each conductive line, wherein each conductive line only checked the part that is electrically connected with the processing device area. Clearly, the tested connective line is shorted with a specific conductive line while the electrical signal appearing on part of the specific conductive line which is connected the said processing device area.

For example, another possible testing process at least has following steps: Initially, connect a probe with part of one tested conductive line, whereby this part is electrically connected with the processing device area. Then, connect another probe with other conductive lines in sequence, and measure the resistance between the tested conductive line and each other conductive line, wherein each conductive line is only measured the part that is electrically connected with the processing device area. Clearly, the tested connective line is shorted with a specific conductive line while the resistance between the tested conductive line and the specific conductive line being approach to zero.

Figure 3A:
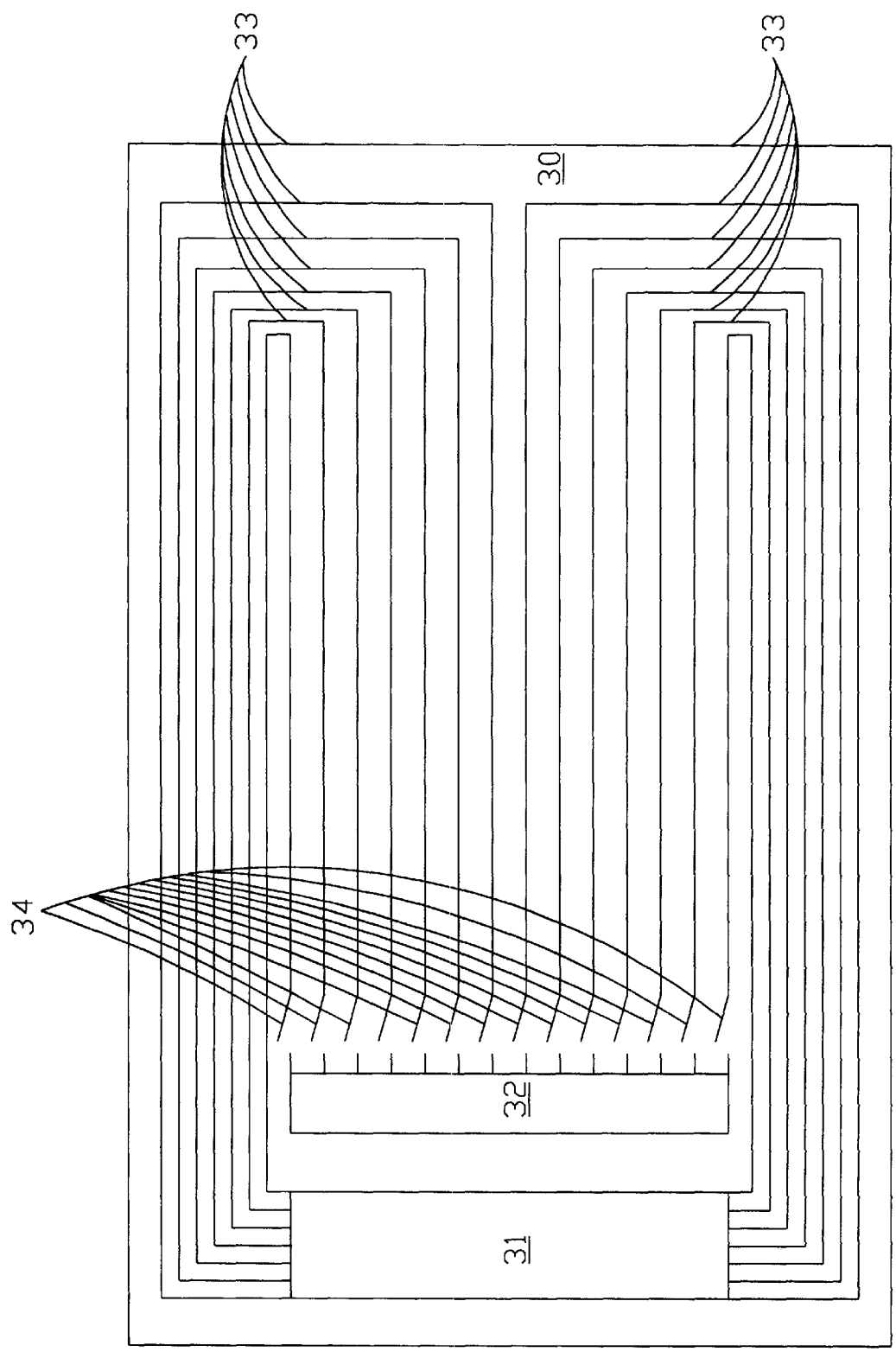
FIG. 3A through FIG. 3B show essential structure of another preferred embodiment of this present invention.
Figure 3B:
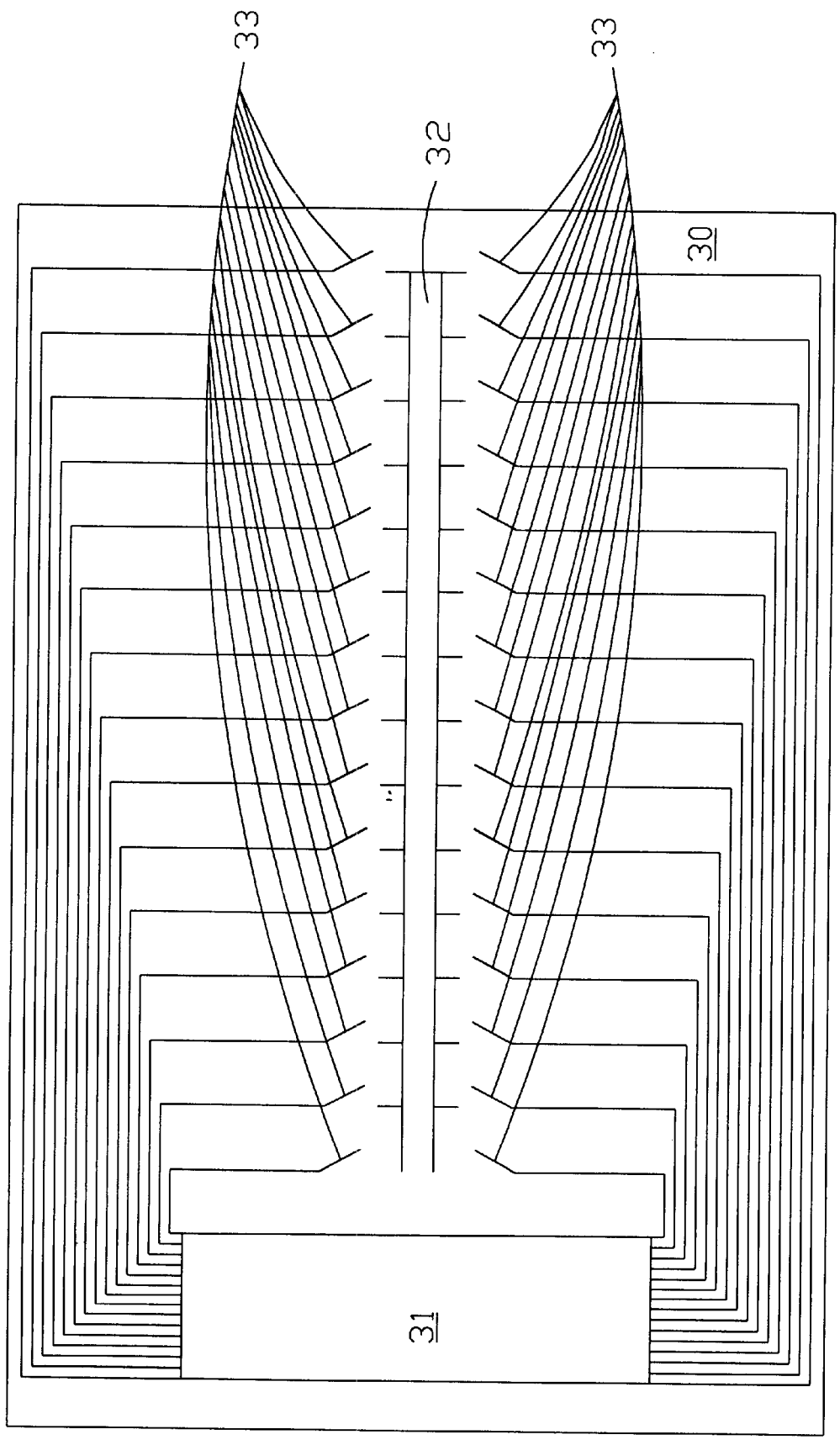

Another preferred embodiment of this invention is a tablet with short testing function. As FIG. 3A and FIG. 3B show, the embodiment at least has the following elements in and on base 30: processing device area 31, ground point 32, and numerous conductive lines 33.

Figure 1B:
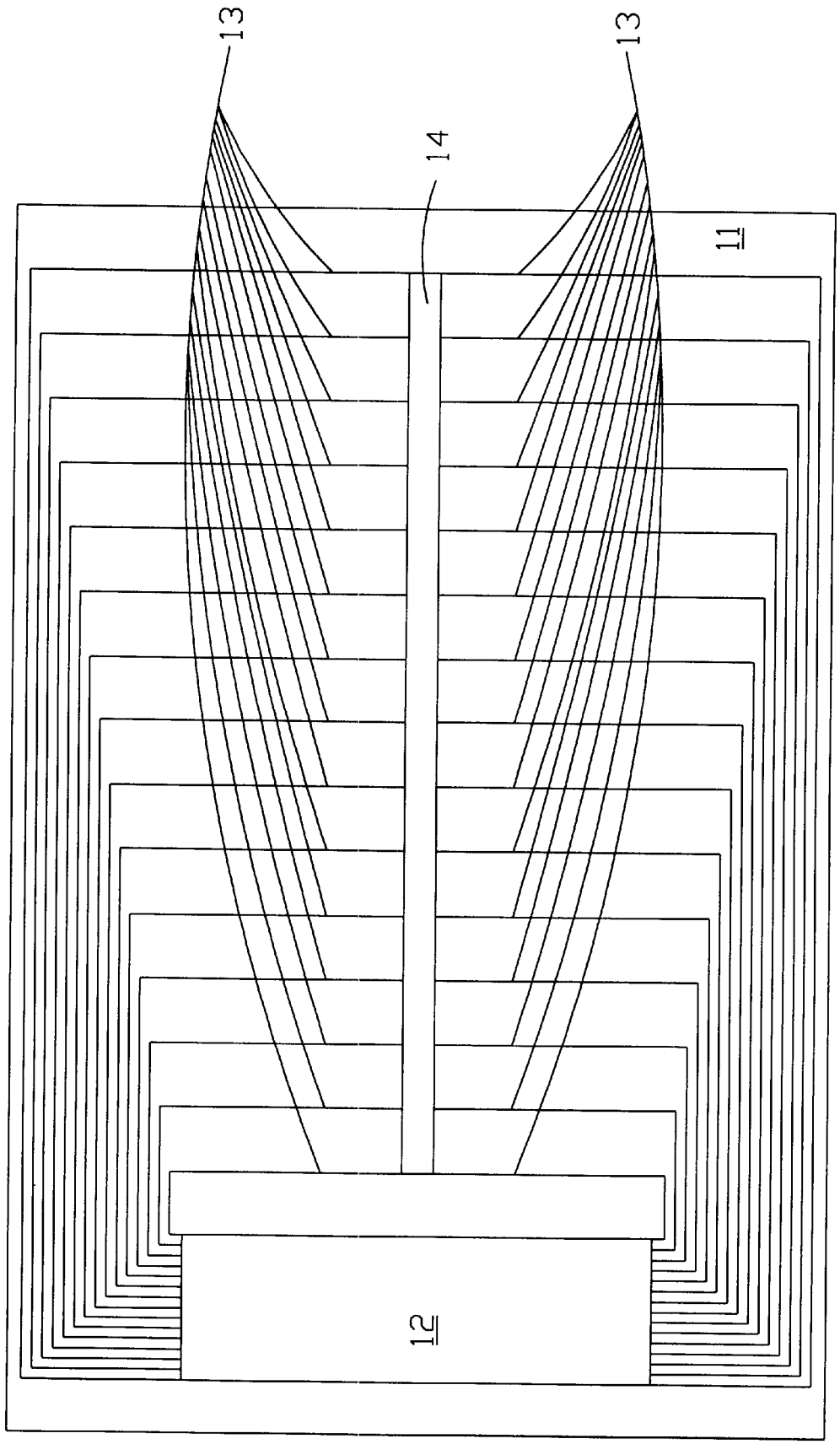

In the embodiment, each conductive line 33 has a first terminal which is electrically connected with processing device area 31 and a second terminal which is electrically connected with ground point 32. Each conductive line 33 also has switch 34 which is located near to the second terminal, and each conductive line 33 is separated from others in the layout of the tablet. Herein, in order to emphasize the difference between this embodiment and conventional tablet, the layout of both FIG. 3A and FIG. 3B is similar with the layout of both FIG. 1A and FIG. 1B, but this embodiment is not resisted by the layout of both FIG. 3A and FIG. 3B.

In general, because conductive lines 33 would form an antenna array for receiving messages from wireless pen, conductive lines 33 usually are located on the center of the tablet. In contrast, processing device area 31 usually is located on the edge of the tablet, and is electrically coupled with ground point 33 through conductive lines 33.

Obviously, because switches are closed to ground point 33, switches 34 almost are located between antenna array and ground point 32. In fact, switches 34 only could let partial conductive lines 33, between these first terminals and switches 34, are electrically separate from ground point 32, but could not let other partial conductive lines 33, between these second terminals and switches 34, are electric ally separate from ground point 32. Thus, in order to maximize the ratio of the partial conductive lines 33 which could be checked, it is better to let switches 34 closed to the second terminals as near as possible. Surely, because each conductive line 33 should be electrically from others, each switch 34 can not be electrically coupled with other switches 34 and only could be electrically with one conductive line 33.

Besides, before a testing process is performed to check whether short is occurred or not, switches 34 are turned off so let each first terminal be electrically separated from the second terminal of same conductive line. Moreover, after the testing process is performed and no short is found, switches 34 are turned on so let each first terminal be electrically coupled with the second terminal of same conductive line 33.

In addition, available varieties of switches 34 at least has transistor, relay, and electronic switch, and all usually are controlled by an electronic circuit. Obviously, application of the electronic circuits could let operation of switches be elastic and programmable. However, in order to simplify whole structure and whole operation, it is possible to let each conductive line 33 have a gap closed to the terminal which is closed to ground point 32 while conductive lines 33 being formed. And fill these gaps by joining with solder to turn on switches 34 only after the testing process is finished and no short is found.

From the foregoing it will be appreciated that, although specific embodiments of the invention have been described herein for the purpose of illustration, various modifications may be made without deviating from the spirit and scope of the invention. Accordingly, the invention is not limited except as by the appended claims.

What is claimed is:

1. A method of measuring tablet, comprising:

providing a tablet, said tablet comprising a processing device area, a ground point and a plurality of separate conductive lines, each said conductive line having a first terminal which is electrically connected with said processing device area and a second terminal which is electrically connected with said ground point, each said conductive line having a switch which is located near to said second terminal;

turning off said switches, so let said processing device area be electrically separated from said ground point; and performing a testing process on each said conductive line in sequence, said testing process measuring the connection between each said conductive line and other said conductive lines to decide whether short is happened.

2. The method of claim 1, said testing process comprising:

applying an electrical signal on part of one tested said conductive line, said part being electrically connected with said processing device area; and measuring other said conductive lines to check said electrical signal appear on which said conductive line, wherein each said conductive line only checked the part that is electrically connected with said processing device area.

3. The method of claim 2, said tested connective line being shorted with a specific conductive line while said electrical signal appearing on part of said specific conductive line which is connected with said processing device area.

4. The method of claim 1, said testing process comprising:

connecting a probe with part of one tested said conductive line, said part being electrically connected with said processing device area;

connecting another probe with other said conductive lines in sequence, and measuring the resistance between said tested conductive line and each other said conductive line, wherein each said conductive line is only measured the part that is electrically connected with said processing device area.

5. The method of claim 4, said tested connective line being shorted with a specific conductive line while the resistance between said tested conductive line and said specific conductive line approaching to zero.

6. The method of claim 1, further comprising the step of performing a repairing process to repair said tablet while at least one short being found.

7. The method of claim 1, further comprising the step of turning on said switches so let each said first terminal be electrically connected with said second terminal of same said conductive line while no short being found.

8. The method of claim 1, the layout of said conductive lines forming a antenna array within said tablet.

9. The method of claim 1, said short being induced by following reasons: the failure during fabrication of said tablet, the failure during storage of said tablet, and the failure during movement of said tablet.

10. A tablet with short testing function, comprising a processing device area;

a ground point; and a plurality of conductive lines, each said conductive line having a first terminal which is electrically connected with said processing device area and a second terminal which is electrically connected with said ground point, each said conductive line having a switch which is located near to said second terminal, wherein each said conductive line is separated from others in the layout of said tablet.

11. The tablet of claim 10, said processing device area being located on the edge of said tablet.

12. The tablet of claim 10, said processing device area being electrically connected with said ground point through said conductive lines.

13. The tablet of claim 10, said conductive lines forming an antenna array within said tablet.

14. The tablet of claim 13, said switches being located between said antenna array and said ground point.

15. The tablet of claim 10, said witches being turned off so let each said first terminal be electrically separated from said second terminal of same said conductive line before a testing process is performed to check whether short is occurred.

16. The tablet of claim 10, said switches being turned on so let each said first terminal be electrically coupled with said second terminal of same said conductive line after a testing process is performed and no short is found.

17. The tablet of claim 16, said switches being fixed on turning on state by joining with solder.

18. The tablet of claim 10, the short between said conductive lines being induced by following reasons: the failure during fabrication of said tablet, the failure during storage of said tablet, and the failure during movement of said tablet.

* * * * *